(12) United States Patent
Taravade

(10) Patent No.: US 6,285,035 B1
(45) Date of Patent: Sep. 4, 2001

(54) APPARATUS FOR DETECTING AN ENDPOINT POLISHING LAYER OF A SEMICONDUCTOR WAFER HAVING A WAFER CARRIER WITH INDEPENDENT CONCENTRIC SUB-CARRIERS AND ASSOCIATED METHOD

(75) Inventor: Kunal N. Taravade, Colorado Springs, CO (US)

(73) Assignee: LSI Logic Corporation, Milpiltas, CA (US)

( * ) Notice: Subject to any disclaimer, the term of this patent is extended or adjusted under 35 U.S.C. 154(b) by 0 days.

(21) Appl. No.: 09/111,529

(22) Filed: Jul. 8, 1998

(51) Int. Cl.$^7$ ..................................................... G01N 21/86
(52) U.S. Cl. ................... 250/559.22; 250/559.4
(58) Field of Search .......................... 250/559.22, 559.4, 250/559.39, 559.3; 356/381, 375; 156/345, 636.1, 627.1; 451/6, 10, 41, 287, 288

(56) References Cited

U.S. PATENT DOCUMENTS

| | | |
|---|---|---|
| 3,734,620 | 5/1973 | Cade ........................................ 356/73 |
| 3,748,014 | 7/1973 | Beiser ...................................... 350/6 |
| 4,312,732 | 1/1982 | Degenkolb et al. ................. 204/192 |
| 4,374,915 | 2/1983 | Ahlquist et al. . |
| 4,632,724 | 12/1986 | Chesebro et al. . |
| 4,689,491 | 8/1987 | Lindow et al. ....................... 250/572 |
| 4,793,895 | 12/1988 | Kaanta et al. ........................ 156/627 |
| 5,036,015 | 7/1991 | Sandhu et al. ............................ 437/8 |
| 5,081,421 | 1/1992 | Miller et al. ........................... 324/671 |
| 5,151,584 * | 9/1992 | Ebbing et al. ..................... 250/201.4 |
| 5,169,491 | 12/1992 | Doan .................................... 156/636 |
| 5,196,353 | 3/1993 | Sandhu et al. ........................... 437/8 |
| 5,222,329 | 6/1993 | Yu ...................................... 51/165.77 |
| 5,240,552 | 8/1993 | Yu et al. .............................. 156/636 |
| 5,245,790 | 9/1993 | Jerbic . |
| 5,245,794 | 9/1993 | Salugsugan ....................... 51/165.74 |
| 5,258,093 | 11/1993 | Maniar . |
| 5,265,378 | 11/1993 | Rostoker ........................... 51/165.75 |
| 5,272,115 | 12/1993 | Sato ..................................... 437/228 |
| 5,308,438 | 5/1994 | Cote et al. ........................... 156/636 |
| 5,310,455 | 5/1994 | Pasch et al. . |
| 5,321,304 | 6/1994 | Rostoker . |
| 5,337,015 | 8/1994 | Lustig et al. ......................... 324/671 |
| 5,362,669 | 11/1994 | Boyd et al. . |
| 5,385,866 | 1/1995 | Bartush . |

(List continued on next page.)

Primary Examiner—Que T. Le

(57) ABSTRACT

An apparatus for polishing a first side of a semiconductor wafer down to a desired level includes a polishing platen having a polishing surface. The apparatus also includes a wafer carrier having a first sub-carrier and a second sub-carrier which is concentric to the first sub-carrier. The first sub-carrier is configured to engage a first radial portion of the wafer by a second side of the wafer and apply first pressure to the first radial portion in order to press the first radial portion against the polishing surface of the polishing platen. The second sub-carrier is configured to engage a second radial portion of the wafer by the second side of the wafer and apply second pressure to the second radial portion in order to press the second radial portion against the polishing surface of the polishing platen. The apparatus yet further includes a first endpoint detector operable to transmit a first light signal which propagates through the first radial portion of the wafer such that a first attenuated signal is emanated out of a second side of the wafer and cause the first sub-carrier to adjust the first pressure applied to the first radial portion of the wafer based on a first intensity level of the first attenuated signal. Moreover, the apparatus includes a second endpoint detector operable to transmit a second light signal which propagates through the first radial portion of the wafer such that a second attenuated signal is emanated out of the second side of the wafer and cause the second sub-carrier to adjust the second pressure applied to the second radial portion of the wafer based on a second intensity level of the second attenuated signal.

28 Claims, 8 Drawing Sheets

U.S. PATENT DOCUMENTS

| | | | |
|---|---|---|---|
| 5,389,194 | 2/1995 | Rostoker et al. . | |
| 5,399,234 | 3/1995 | Yu et al. | 156/636 |
| 5,403,228 | 4/1995 | Pasch . | |
| 5,405,806 | 4/1995 | Pfiester et al. | 437/200 |
| 5,439,551 | 8/1995 | Meikle et al. . | |
| 5,449,314 | 9/1995 | Meikle et al. . | |
| 5,483,568 | 1/1996 | Yano et al. | 378/44 |
| 5,492,594 | 2/1996 | Burke et al. | 216/86 |
| 5,516,400 | 5/1996 | Pasch et al. . | |
| 5,531,861 | 7/1996 | Yu et al. | 156/636.1 |
| 5,559,428 | 9/1996 | Li et al. | 324/71.5 |
| 5,561,541 | 10/1996 | Sharp et al. | 359/66 |
| 5,595,526 | 1/1997 | Yau et al. | 451/8 |
| 5,597,442 | 1/1997 | Chen et al. | 156/626.1 |
| 5,597,590 | 1/1997 | Tanimoto et al. . | |
| 5,607,341 | 3/1997 | Leach | 451/41 |
| 5,609,511 | 3/1997 | Moriyama et al. | 451/5 |
| 5,614,446 | 3/1997 | Ramaswami et al. . | |
| 5,624,304 | 4/1997 | Pasch et al. . | |
| 5,626,715 | 5/1997 | Rostoker . | |
| 5,627,110 | 5/1997 | Lee et al. . | |
| 5,637,185 | 6/1997 | Murarka et al. | 438/5 |
| 5,639,388 | 6/1997 | Kimura et al. | 216/84 |
| 5,643,046 | 7/1997 | Katakabe et al. . | |
| 5,643,050 | 7/1997 | Chen | 451/10 |
| 5,643,061 | 7/1997 | Jackson et al. | 451/289 |
| 5,644,221 | 7/1997 | Li et al. | 324/71.5 |
| 5,645,682 | 7/1997 | Skrovan . | |
| 5,647,952 | 7/1997 | Chen | 156/636.1 |
| 5,656,229 | 8/1997 | Tanimoto et al. . | |
| 5,658,183 | 8/1997 | Sandhu et al. | 451/5 |
| 5,660,672 | 8/1997 | Li et al. | 156/345 |
| 5,663,101 | 9/1997 | Cronin . | |
| 5,663,979 | 9/1997 | Sandhu | 438/16 |
| 5,664,987 | 9/1997 | Rentein | 451/21 |
| 5,667,424 | 9/1997 | Pan | 451/6 |
| 5,667,433 | 9/1997 | Mallon . | |
| 5,667,629 | 9/1997 | Pan et al. | 438/13 |
| 5,668,063 | 9/1997 | Fry et al. | 438/5 |
| 5,670,410 | 9/1997 | Pan | 437/60 |
| 5,672,091 | 9/1997 | Takahashi et al. | 451/6 |
| 5,674,784 | 10/1997 | Jang et al. | 437/195 |
| 5,681,215 | 10/1997 | Sherwood et al. | 451/388 |
| 5,691,253 | 11/1997 | Kobayashi . | |
| 5,695,660 | 12/1997 | Litvak | 216/85 |
| 5,700,189 | 12/1997 | Sandhu et al. | 451/5 |
| 5,702,292 | 12/1997 | Brunelli et al. . | |
| 5,704,987 | 1/1998 | Huynh et al. . | |
| 5,705,320 | 1/1998 | Hsu et al. . | |
| 5,705,435 | 1/1998 | Chen | 438/8 |
| 5,710,076 | 1/1998 | Dai et al. | 438/305 |
| 5,712,185 | 1/1998 | Tsai et al. | 437/67 |
| 5,716,873 | 2/1998 | Prall et al. . | |
| 5,720,845 * | 2/1998 | Liu | 156/345 |
| 5,722,875 | 3/1998 | Iwashita et al. | 451/8 |
| 5,722,877 | 3/1998 | Meyer et al. . | |
| 5,725,417 | 3/1998 | Robinson . | |
| 5,736,462 | 4/1998 | Takahashi et al. . | |
| 5,738,567 | 4/1998 | Manzonie et al. . | |
| 5,741,171 | 4/1998 | Sarfaty et al. | 451/6 |
| 5,747,380 | 5/1998 | Yu et al. . | |
| 5,755,614 | 5/1998 | Adams et al. . | |
| 5,762,536 | 6/1998 | Pant et al. . | |
| 5,762,537 | 6/1998 | Sandhu et al. . | |
| 5,777,739 | 7/1998 | Sandhu et al. | 356/357 |
| 5,795,495 | 8/1998 | Meikle . | |
| 5,861,055 | 1/1999 | Allman et al. . | |
| 5,865,666 | 2/1999 | Nagahara . | |
| 5,868,608 | 2/1999 | Allman et al. . | |
| 5,882,244 | 3/1999 | Hiyama et al. . | |
| 5,882,251 | 3/1999 | Berman et al. . | |
| 5,888,120 | 3/1999 | Doran . | |
| 5,893,756 | 4/1999 | Berman et al. . | |
| 5,931,719 | 8/1999 | Nagahara et al. . | |
| 5,948,697 | 9/1999 | Hata . | |
| 5,957,757 | 9/1999 | Berman . | |

* cited by examiner

APPARATUS FOR DETECTING AN ENDPOINT POLISHING LAYER OF A SEMICONDUCTOR WAFER HAVING A WAFER CARRIER WITH INDEPENDENT CONCENTRIC SUB-CARRIERS AND ASSOCIATED METHOD

CROSS REFERENCE

Cross reference is made to copending U.S. patent application Ser. No. 09/112,222, entitled "Method and Apparatus for Detecting an Endpoint Polishing Layer by Transmitting Infrared Light Signals through a Semiconductor Wafer" by Kunal Taravade, which is assigned to the same assignee as the present invention, and which is filed concurrently herewith.

TECHNICAL FIELD OF THE INVENTION

The present invention relates generally to an apparatus and method for detecting an endpoint polishing layer of a semiconductor wafer, a more particularly to an apparatus for detecting an endpoint layer of a semiconductor wafer having a wafer carrier with independent concentric sub-carriers and associated method.

BACKGROUND OF THE INVENTION

Semiconductor integrated circuits are typically fabricated by a layering process in which several layers of material are fabricated on or in a surface of a wafer, or alternatively, on a surface of a previous layer. This fabrication process typically requires subsequent layers to be fabricated upon a smooth, planar surface of a previous layer. However, the surface topography of layers may be uneven due to an uneven topography associated with an underlying layer. As a result, a layer may need to be polished in order to present a smooth, planar surface for a subsequent processing step. For example, a layer may need to be polished prior to formation of a conductor layer or pattern on an outer surface of the layer.

In general, a semiconductor wafer may be polished to remove high topography and surface defects such as crystal lattice damage, scratches, roughness, or embedded particles of dirt or dust. The polishing process typically is accomplished with a polishing system that includes top and bottom platens (e.g. a polishing table and a wafer carrier or holder), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate higher removal rates, along with the selective removal of materials fabricated on the semiconductor wafer. This polishing process is often referred to as chemical mechanical planarization or chemical mechanical polishing (CMP).

In these polishing processes, it is often important to determine an endpoint of the polishing process. Overpolishing (removing too much) of a conductive layer results in increased circuit resistance and potential scrapping of the semiconductor wafer. Since many processing steps have occurred prior to the polishing process, scrapping a semiconductor wafer during fabrication may undesirably result in significant financial loss. Underpolishing (removing too little) of a conductive layer on the other hand leads to failure in isolating circuits and results in electrical shorts. Presence of such electrical shorts leads to rework (redoing the CMP process) thereby disadvantageously increasing costs (e.g. production costs) associated with the semiconductor wafer. Thus, a precise endpoint detection technique is needed.

A typical method employed for determining the endpoint in polishing systems is to measure the amount of time needed to planarize a first wafer, and thereafter polishing the remaining wafers for a similar amount of time. In practice this method is extremely time consuming since machine operators must inspect each wafer after polishing. In particular, it is extremely difficult to precisely control the removal rate of material since the removal rate may vary during the polishing of an individual wafer. Moreover, the removal rate may be diminished in the process of polishing a number of wafers in sequence.

Another method employed for determining endpoint in polishing systems is to form a polishing endpoint layer in the semiconductor device, and thereafter polish the semiconductor device down to the polishing endpoint layer. To this end, polishing systems detect when the polishing process reaches the polishing endpoint layer and terminate the polishing process in response to reaching the polishing endpoint layer. Various techniques have been used to detect when the polishing process reaches the polishing endpoint layer. For example, U.S. Pat. No. 5,668,063 issued to Fry et al polishes a semiconductor device down to a tracer layer of detectable material. The polishing system of Fry determines that the tracer layer has been reached when a chemical element detector detects if materials, such as boron or phosphorous, associated with the tracer layer have been removed by the polishing process. However, such techniques undesirably require relatively complex chemical analysis equipment thereby undesirably increasing costs associated with the semiconductor wafers.

Thus, a continuing need exists for a method and an apparatus which accurately and efficiently detects when a polishing system polishes a semiconductor device down to a desired polishing endpoint layer.

SUMMARY OF THE INVENTION

In accordance with a first embodiment of the present invention, there is provided an apparatus for polishing a first side of a semiconductor wafer down to a desired level. The apparatus includes a polishing platen having a polishing surface. The apparatus also includes a wafer carrier having a first sub-carrier and a second sub-carrier which is concentric to the first sub-carrier. The first sub-carrier is configured to engage a first radial portion of the wafer by a second side of the wafer and apply first pressure to the first radial portion in order to press the first radial portion against the polishing surface of the polishing platen. The second sub-carrier is configured to engage a second radial portion of the wafer by the second side of the wafer and apply second pressure to the second radial portion in order to press the second radial portion against the polishing surface of the polishing platen. The apparatus also includes a first endpoint detector operable to determine when the first radial portion of the wafer has reached the desired level and cause the first sub-carrier to adjust the first pressure applied to the first radial portion of the wafer in response to determining that the first radial portion has reach the desired level. Moreover, the apparatus includes a second endpoint detector operable to determine when the second radial portion of the wafer has reached the desired level and cause the second sub-carrier to adjust the second pressure applied to the second radial portion of the wafer in response to determining that the second radial portion has reach the desired level.

Pursuant to a second embodiment of the present invention, there is provided a method of operating a polishing system to polish a first side of a semiconductor wafer down to a desired level. The polishing system has a wafer carrier which includes a first sub-carrier and a second sub-carrier which is concentric to the first sub-carrier. The method includes the step of rotating the wafer while the first side of the wafer contacts a polishing surface of a polishing platen in order to remove material from the first side of the wafer. The method also includes the step of applying first pressure to a first radial portion of the wafer with the first sub-carrier in order to press the first radial portion against the polishing surface of the polishing platen. The method further includes the step of applying second pressure to a second radial portion of the wafer with the second sub-carrier in order to press the second radial portion against the polishing surface of the polishing platen. Moreover, the method includes the step of determining when the first radial portion of the wafer has been polished down to the desired level and adjusting the first pressure applied to the first radial portion by the first sub-carrier in response thereto. Yet further, the method includes the step of determining when the second radial portion of the wafer has been polished down to the desired level and adjusting the second pressure applied to the second radial portion by the second sub-carrier in response thereto.

Pursuant to a third embodiment of the present invention, there is provided an apparatus for polishing a first side of a semiconductor wafer down to a desired level. The apparatus includes a polishing platen having a polishing surface. The apparatus also includes a wafer carrier having a first sub-carrier and a second sub-carrier which is concentric to the first sub-carrier. The first sub-carrier is configured to engage a first radial portion of the wafer by a second side of the wafer and apply first pressure to the first radial portion in order to press the first radial portion against the polishing surface of the polishing platen. The second sub-carrier is configured to engage a second radial portion of the wafer by the second side of the wafer and apply second pressure to the second radial portion in order to press the second radial portion against the polishing surface of the polishing platen. The apparatus yet further includes a first endpoint detector operable to transmit a first light signal which propagates through the first radial portion of the wafer such that a first attenuated signal is emanated out of a second side of the wafer and cause the first sub-carrier to adjust the first pressure applied to the first radial portion of the wafer based on a first intensity level of the first attenuated signal. Moreover, the apparatus includes a second endpoint detector operable to transmit a second light signal which propagates through the first radial portion of the wafer such that a second attenuated signal is emanated out of the second side of the wafer and cause the second sub-carrier to adjust the second pressure applied to the second radial portion of the wafer based on a second intensity level of the second attenuated signal.

It is an object of the present invention to provide a new and useful method and apparatus for determining an endpoint layer of a polishing process.

It is an object of the present invention to provide an improved method and apparatus for determining an endpoint layer of a polishing process.

It is a further object of the present invention to provide a method and apparatus for determining that a polishing system has polished a wafer down to a polishing endpoint without removing the wafer from the polishing system.

It is yet further an object of the present invention to provide a method and apparatus for determining that a polishing system has polished a wafer down to a polishing endpoint that is less mechanically complex relative to polishing systems which have heretofore been designed.

It is also an object of the present invention to provide a method and apparatus for determining that a polishing system has polished a wafer down to a polishing endpoint which does not require chemical analysis of the slurry associated with the polishing system.

It is moreover an object of the present invention to provide a method and apparatus for determining that a polishing system has polished individual radial portions of a wafer down to a polishing endpoint.

The above and other objects, features, and advantages of the present invention will become apparent from the following description and the attached drawings.

DETAILED DESCRIPTION OF A PREFERRED EMBODIMENT

Figure 1A:
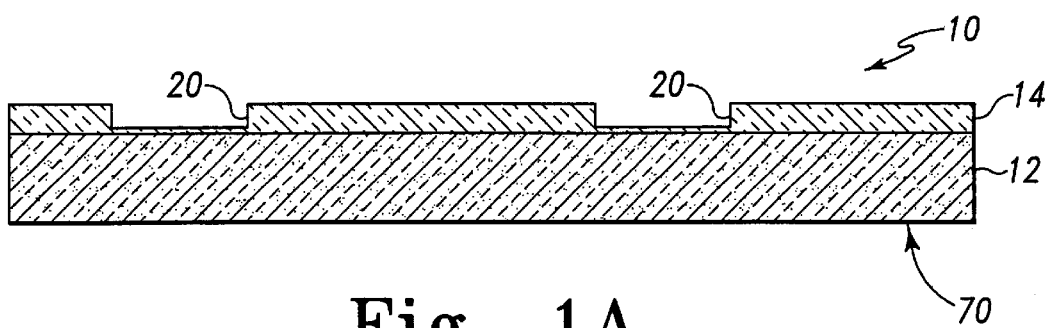
FIGS. 1A–1F show sectional views of a semiconductor wafer during various steps of a fabrication process.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 1B:
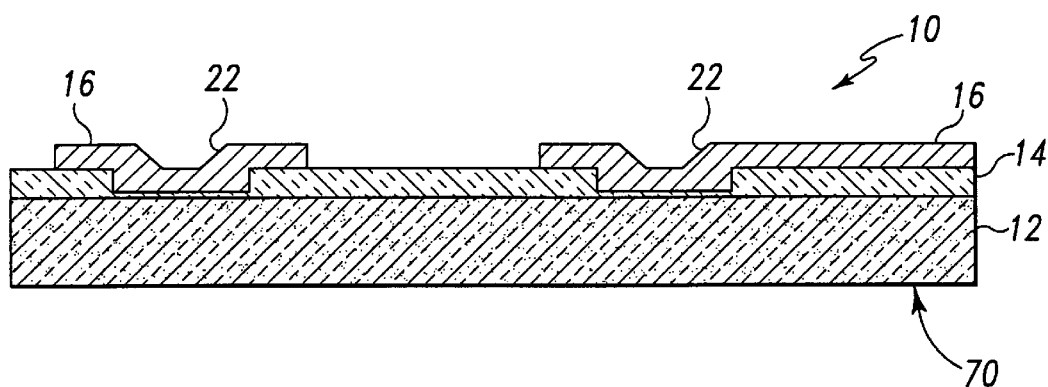

Referring now to FIGS. 1A–1F, there is shown a semiconductor wafer 10 after various steps of a fabrication process of the present invention. In particular, FIGS. 1A and 1B show the semiconductor wafer 10 after a number of fabrication steps. The semiconductor wafer 10 includes a semiconductor substrate 12, such as silicon. A first insulating layer 14 and a first metal layer 16 are deposited or otherwise disposed on the semiconductor substrate 12. In particular, the fabrication process deposits the first insulating layer 14 on the semiconductor substrate 12 such that a contact hole 20 is formed in the first insulating layer 14 at a location above a transistor portion of the semiconductor substrate 12. Moreover, the fabrication process patterns the first metal layer 16 (e.g. aluminum) over the first insulating layer 14 and the contact hole 20. As a result, the first metal layer 16 fills the contact hole 20 forming an electrical contact with the transistor portion of the semiconductor substrate 12. Moreover, the filling of the contact hole 20 forms a pit 22 in the portion of the first metal layer 16 disposed above the contact hole 20.

Figure 1C:
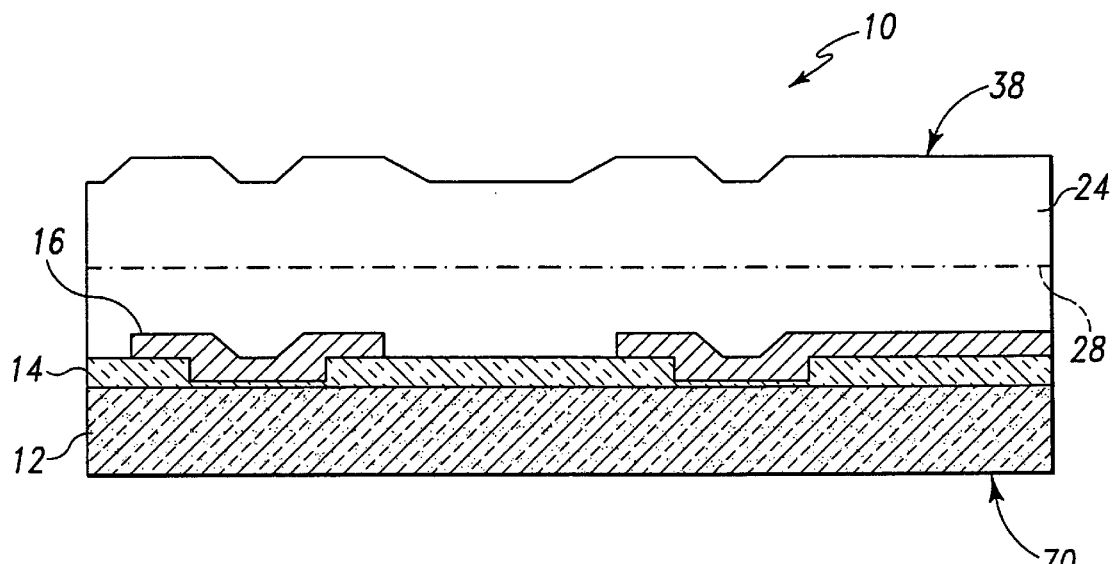
Figure 1D:
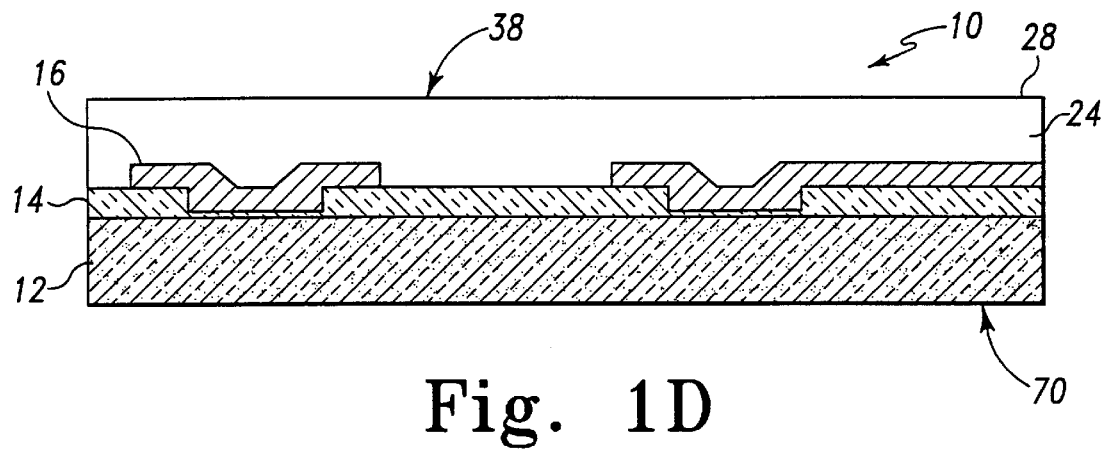

As shown in FIG. 1C, a second insulating layer 24 is deposited on the outer surface of the first insulating layer 14 and the first metal layer 16. The second insulating layer 24 has an uneven surface topography as a result of the varying topography associated with the first insulating layer 14 and a first metal layer 16. The uneven surface topography of the second insulating layer 24 may cause accuracy problems in fabricating additional layers associated with the semiconductor wafer 10. For example, the uneven surface topography may cause accuracy problems for a lithography process which is utilized to pattern a second metal layer 26 (FIG. 1F) on the second insulating layer 24. As shall be discussed below in more detail, in order to avoid such accuracy problems associated with the uneven topography of the second insulating layer 24, a polishing system, such as a polishing system 30 of FIG. 2, polishes the second insulating layer 24 down to a desired level 28 thereby planarizing the surface of the second insulating layer 24 (see FIG. 1D).

Figure 1E:
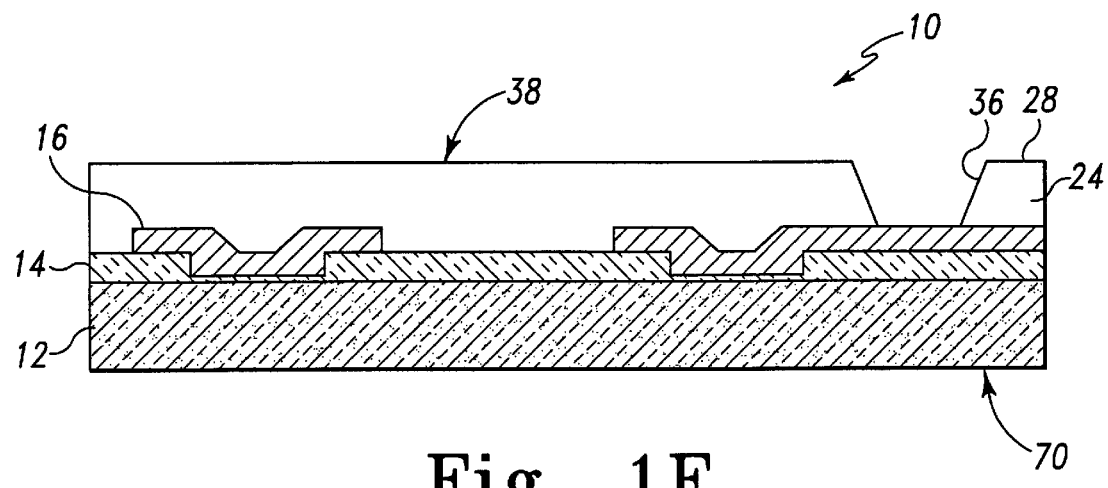
Figure 1F:
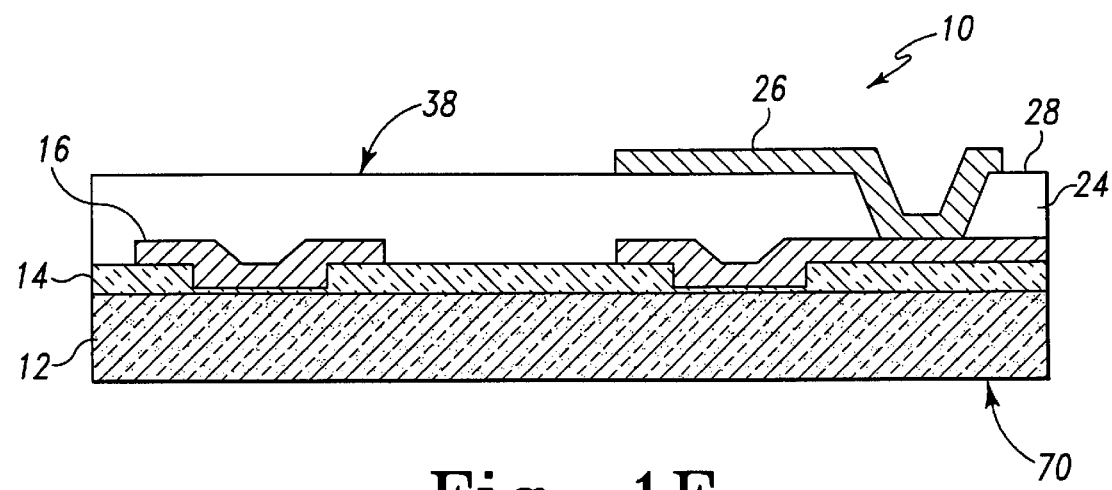

As alluded to above, once the semiconductor wafer 10 has been polished such that a planar surface is created, additional layers may be deposited or otherwise fabricated thereon. For example, as shown in FIGS. 1E and 1F, a via hole 36 may be etched through the second insulating layer 24. Thereafter, the second metal layer 26 may be deposited on the second insulating layer 24. It should be appreciated that numerous additional layers may be deposited on the semiconductor wafer 10 in the manner previously described.

Figure 2:
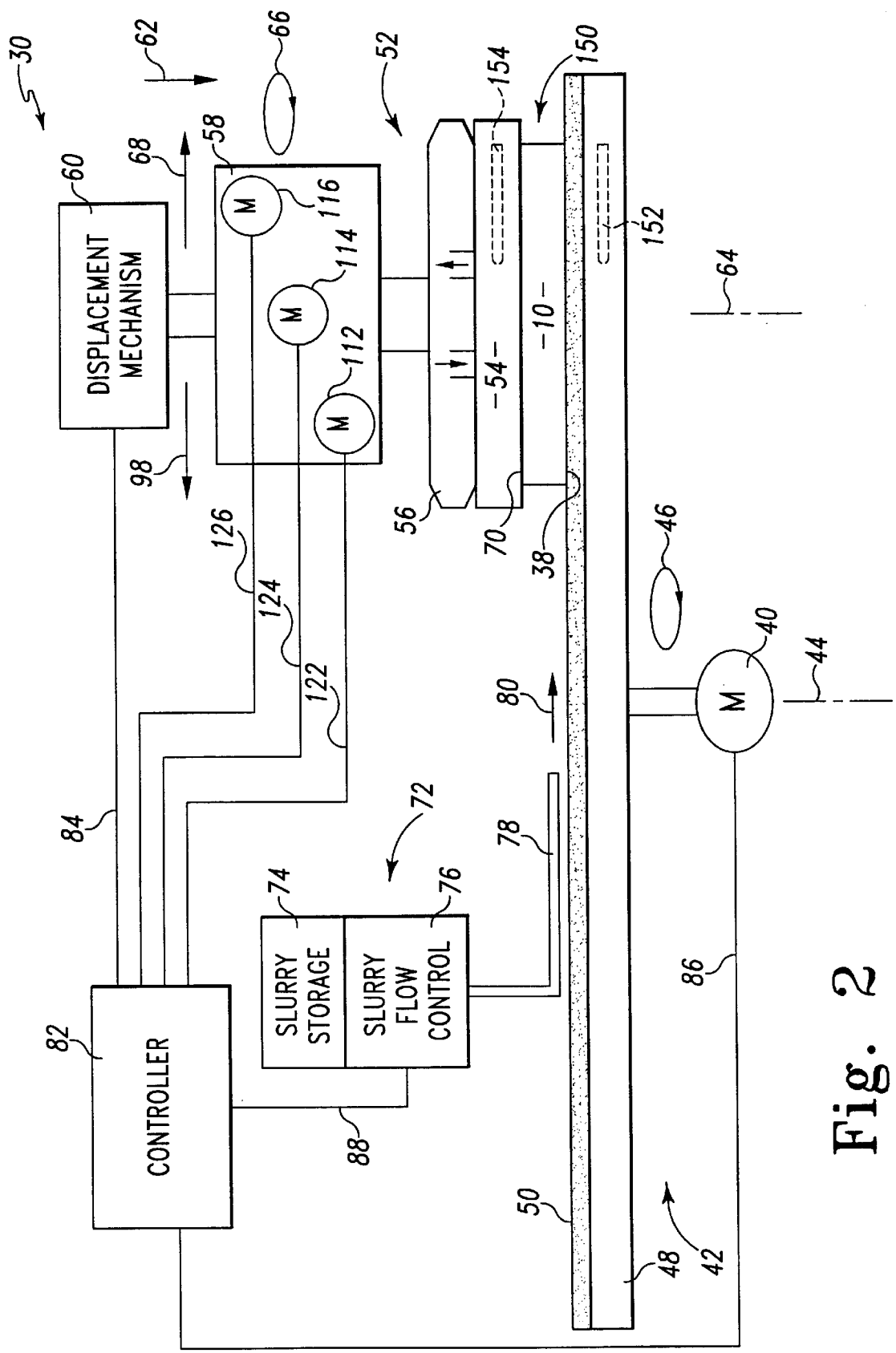
FIG. 2 shows an embodiment of a polishing system which incorporates various features of the present invention therein.

Referring now to FIG. 2, there is shown a preferred embodiment of the polishing system 30 which is used to planarize a front side or surface 38 of the semiconductor wafer 10. The polishing system 30 includes a platen motor or other drive mechanism 40 and a platen assembly 42. The platen motor 40 rotates the platen assembly 42 about a center axis 44. The platen motor 40 may rotate the platen assembly 42 in a clockwise direction (as shown by arrow 46 of FIG. 2) or in the counterclockwise direction.

The platen assembly 42 includes a polishing platen 48 and a polishing pad 50 mounted on the polishing platen 48. Both the polishing platen 48 and the polishing pad 50 are preferably circular and collectively define a polishing surface against which the front side 38 of the semiconductor wafer 10 may be polished. Moreover, the polishing pad 50 is typically made of blown polyurethane which protects the polishing platen 48 from chemical slurry and other chemicals introduced during the polishing process.

Figure 3:
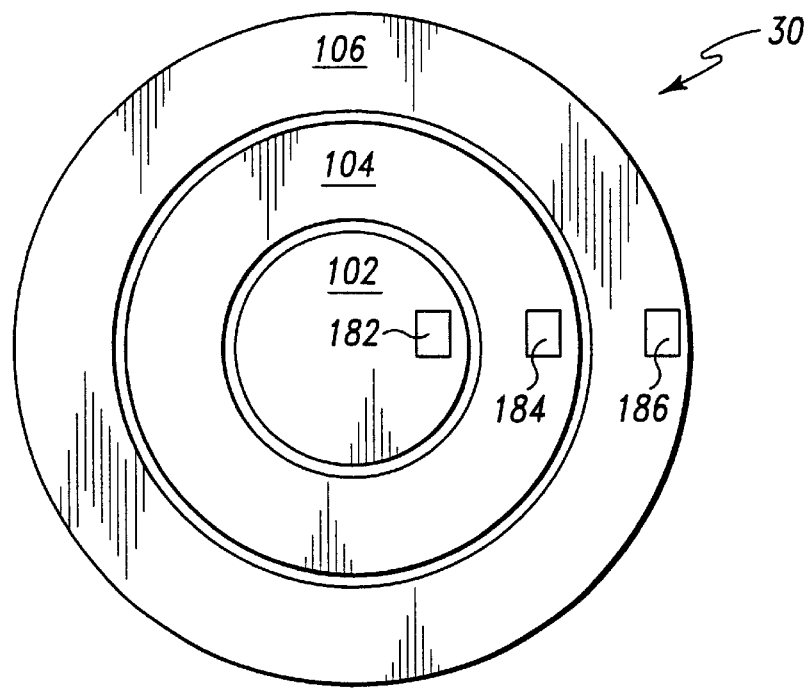
FIG. 3 is an enlarged bottom elevational view of the wafer carrier of the polishing system of FIG. 2.
Figure 8:
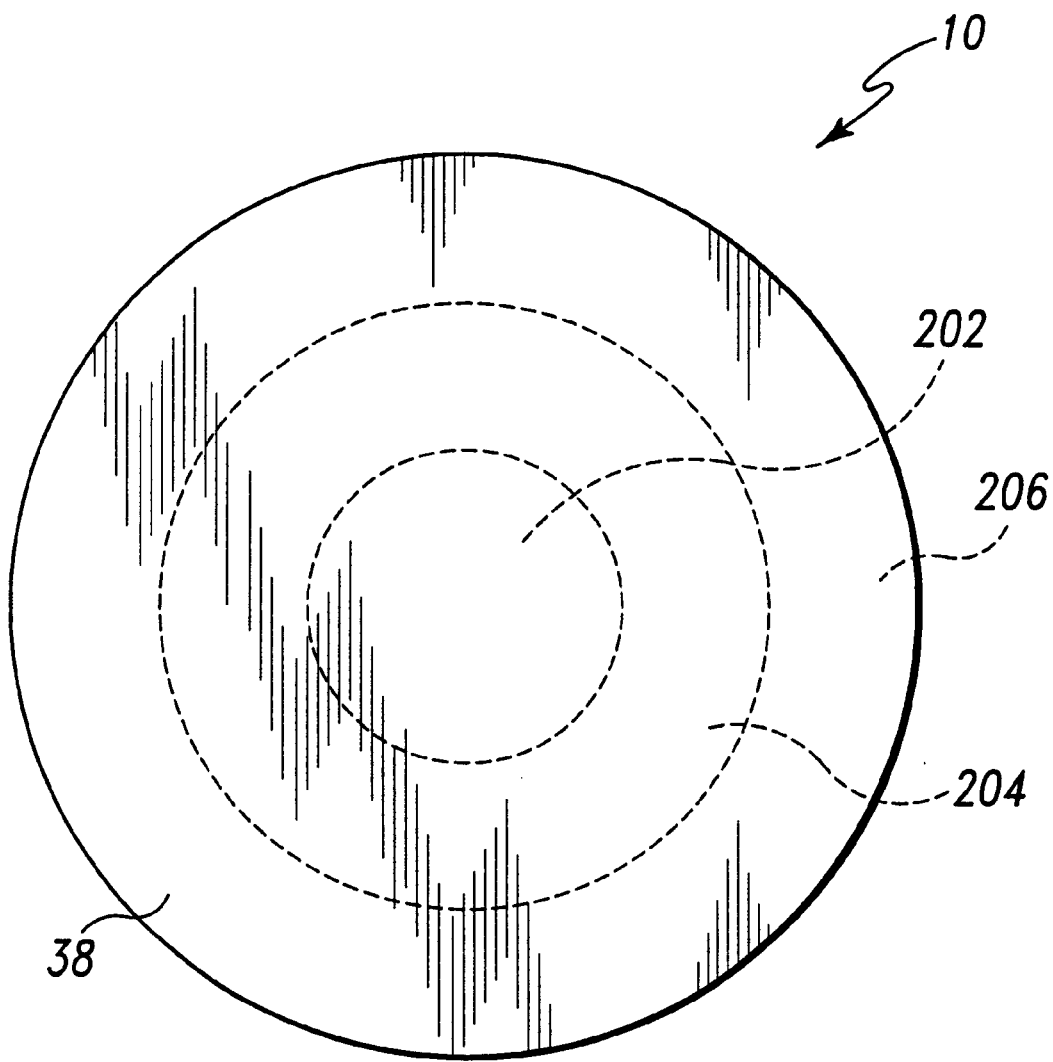
FIG. 8 is an enlarged elevational view of a semiconductor wafer of FIG. 1.

The polishing system 30 also includes a polishing head assembly 52. The polishing head assembly 52 includes a wafer carrier 54, a cooling mechanism 56, a wafer carrier motor assembly 58, and a wafer carrier displacement mechanism 60. The wafer carrier 54 applies a controlled, adjustable downward force in the general direction of arrow 62 of FIG. 2 in order to press the front side 38 of the semiconductor wafer 10 into contact with the polishing pad 50 so as to facilitate polishing of the front side 38 of the semiconductor wafer 10. In particular, as shown in FIG. 3, the wafer carrier 54 includes an inner sub-carrier 102, an intermediate sub-carrier 104, and an outer sub-carrier 106. Each of the sub-carriers 102, 104, 106 rotate independently of one another. As shall be discussed below in more detail, such independent rotation of the wafer sub-carriers 102, 104, 106 facilitates the application of force to a corresponding radial portion 202, 204, 206 (see FIG. 8) of the semiconductor wafer 10 during polishing thereof.

The carrier motor assembly includes a number of wafer carrier motors 112, 114, 116. The wafer carrier motors 112, 114, 116 are mechanically coupled to the wafer sub-carriers 102, 104, 106, respectively, through a drive mechanism or the like (not shown) in order to rotate the wafer sub-carriers 102, 104, 106, respectively, and hence the semiconductor wafer 10 about a center axis 64. Hence, actuation of the wafer carrier motor 112 causes rotation of the inner wafer sub-carrier 102 thereby increasing the downward force applied to the inner radial portion 202 of the semiconductor wafer 10. Similarly, actuation of the wafer carrier motor 114 causes rotation of the intermediate wafer sub-carrier 104 thereby increasing the downward force applied to the intermediate radial portion 204 of the semiconductor wafer 10. Moreover, actuation of the wafer carrier motor 116 causes rotation of the outer wafer sub-carrier 106 thereby increasing the downward force applied to the outer radial portion 206 of the semiconductor wafer 10.

The wafer carrier motors 112, 114, 116 may rotate the wafer sub-carriers 102, 104, 106, respectively, in a clockwise direction (as shown by arrow 66 of FIG. 2) or in the counterclockwise direction. However, the wafer carrier motors 112, 114, 116 preferably rotate the wafer sub-carriers 102, 104, 106, respectively, in the same rotational direction as the platen motor 40 rotates the platen assembly 42 (although the wafer carrier motors 112, 114, 116 may rotate the semiconductor wafer 10 in the rotational direction opposite the rotational direction of the platen assembly 42 as desired).

Each of the wafer sub-carriers 102, 104, 106 includes mechanisms (not shown) for holding the semiconductor wafer 10. For example, the wafer sub-carriers 102, 104, 106 may include a vacuum-type mechanism which generates a vacuum force that draws the corresponding radial portions 202, 204, 206, respectively, of the semiconductor wafer 10 against the wafer sub-carriers 102, 104, 106. Once the semiconductor wafer 10 is positioned on the wafer sub-carriers 102, 104, 106 and held in contact with the platen assembly 42 for polishing, the vacuum force may be removed. In such an arrangement, each of the wafer sub-carriers 102, 104,106 may be designed with a friction surface or a carrier pad which engages a back side 70 of the semiconductor wafer 10. Such a carrier pad, along with the downward force being applied to the semiconductor wafer 10, creates a frictional force between the wafer sub-carriers 102, 104, 106 and the semiconductor wafer 10 that effectively holds the semiconductor wafer 10 against the wafer carrier 54. It should be appreciated that such vacuum mechanisms and carrier pads are of conventional design and are commercially available.

The cooling mechanism 56 counteracts heat generated during the polishing process in order to maintain the wafer sub-carriers 102, 104, 106 at a substantially constant temperature. In particular, the cooling mechanism 56 neutralizes the heat generated due to friction and a chemical slurry reacting with the front side 38 of the semiconductor wafer 10.

The displacement mechanism 60 selectively moves the wafer carrier 54 and hence the semiconductor wafer 10 across the platen assembly 42 as indicated by arrows 68 and 98. Such movement defines a polishing path which may be linear, sinusoidal, or a variety of other patterns. The displacement mechanism 60 is also capable of moving the semiconductor wafer 10 along a polishing path to a location beyond the edge of the polishing pad 50 so that the semiconductor wafer 10 "overhangs" the edge. Such an overhanging arrangement permits the semiconductor wafer 10 to be moved partially on and partially off the polishing pad 50 to compensate for polishing irregularities caused by a relative velocity differential between the faster moving outer portions and the slower moving inner portions of the platen assembly 42.

The polishing system 30 also includes a chemical slurry system 72. The slurry system 72 includes a slurry storage reservoir 74, a slurry flow control mechanism 76, and a slurry conduit 78. The slurry storage reservoir 74 includes one or more containers for storing slurry. In particular, the slurry storage reservoir 74 contains a chemical slurry that includes abrasive material which facilitates polishing of the front side 38 of the semiconductor wafer 10 and reactants which selectively react to certain materials of the front side 38 of the semiconductor wafer 10. Chemical slurries having such properties are well known and commercially available.

The slurry flow control mechanism 76 controls the flow of slurry from the slurry storage 74, through the slurry conduit 78, and onto the polishing area atop the platen assembly 42. Hence, the slurry flow control mechanism 76 and the slurry conduit 78 selectively introduce a flow of slurry (as indicated by arrow 80) atop the polishing pad 50.

Figure 4:
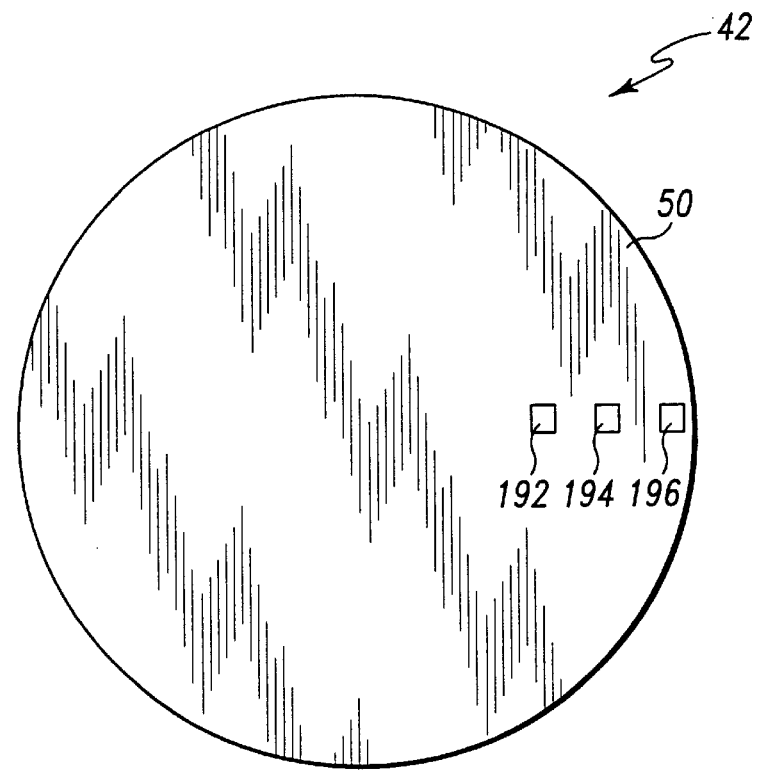
FIG. 4 is a top elevational view of the platen assembly of the polishing system of FIG. 2.
Figure 7:
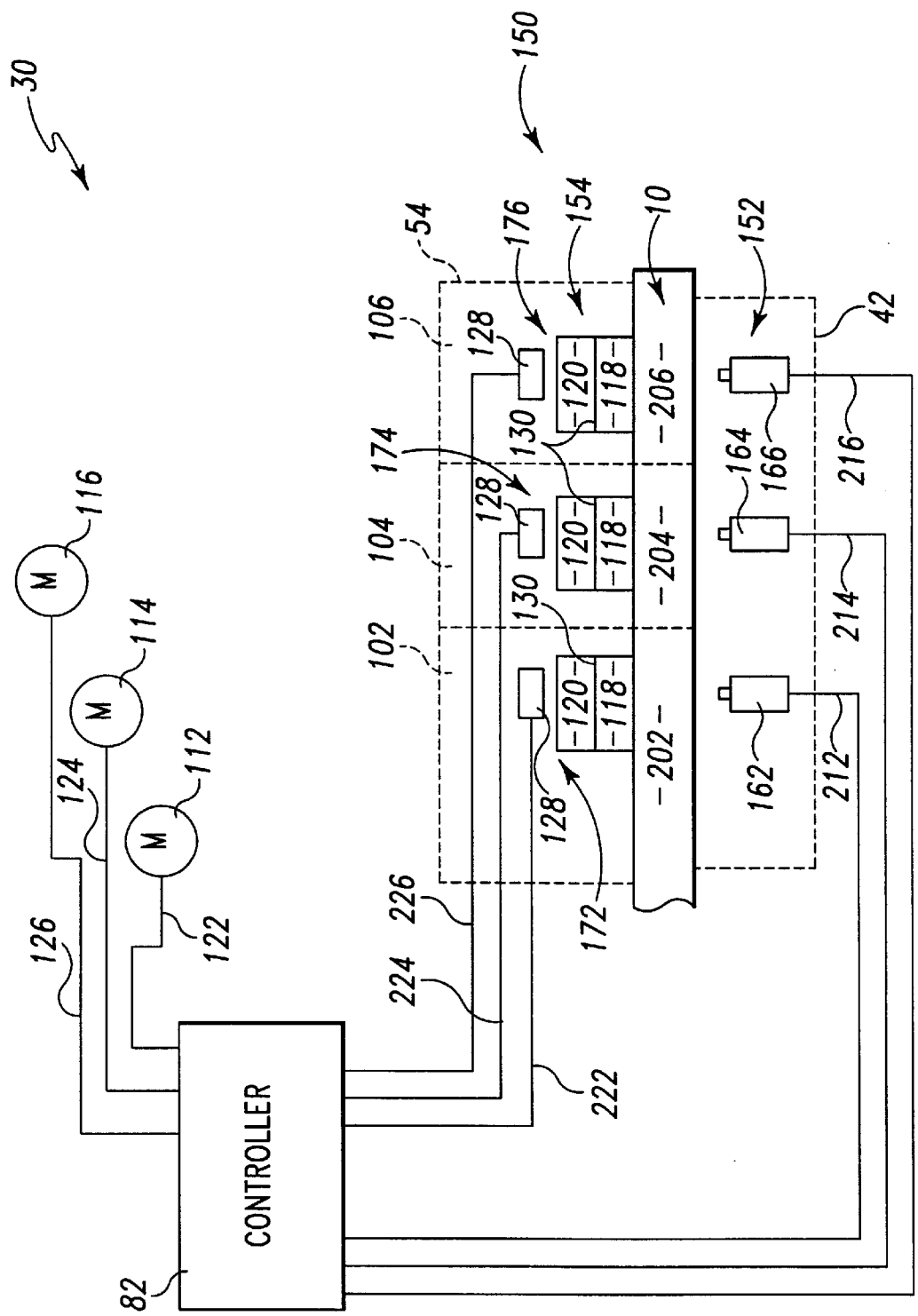
FIG. 7 is a diagrammatic view of the polishing system of FIG. 2 which shows the endpoint detection system in greater detail.

The polishing system also includes an endpoint detection system 150. As shown in FIGS. 2 and 7, the endpoint detection system 150 includes a light source array 152 and a light receiver array 154. The light source array 152 is secured within the platen assembly 42 and includes a number of infrared light source units 162, 164, 166. As shown in FIG. 4, the platen assembly 42 has a number of a light egress openings 192, 194, 196 defined therein. The infrared light source units 162, 164, 166 are secured within the platen assembly 42 such that infrared light signals generated by the light source units 162, 164, 166 emanate from the light egress openings 192, 194, 196, respectively. It should be appreciated that each of the light egress openings 192, 194, 196 may be covered with a protective covering so as to prevent slurry or debris from entering the portion of the platen assembly 42 in which the infrared light source units 162, 164, 166 are secured.

The light receiver array 154 includes a number of light receiving units 172, 174, 176 and is secured within the wafer carrier 54. In particular, the light receiving unit 172 is secured within the inner wafer sub-carrier 102. As shown in FIG. 3, the wafer sub-carrier 102 has a light ingress opening 182 defined therein. Infrared light signals advancing through the light ingress opening 182 are received into the light receiving unit 172. Similarly, the light receiving unit 174 is secured within the intermediate wafer sub-carrier 104. As shown in FIG. 3, the wafer sub-carrier 104 has a light ingress opening 184 defined therein. Infrared light signals advancing through the light ingress opening 184 are received into the light receiving unit 174. Moreover, the light receiving unit 176 is secured within the outer wafer sub-carrier 106. As shown in FIG. 3, the wafer sub-carrier 106 has a light ingress opening 186 defined therein. Infrared light signals advancing through the light ingress opening 186 are received into the light receiving unit 186. It should be appreciated that each of the light ingress openings 182, 184, 186 may be covered with a protective covering so as to prevent slurry or debris from entering the portion of the sub-carriers 102, 104, 106 in which the light receiving units 172, 174, 176, respectively, are secured.

As shown in FIG. 7, each of the light receiving units 172, 174, 176 includes a first or linear optical material 118, a second or nonlinear optical material 120, and an infrared light detector 128. The linear optical material 118 and the nonlinear optical material 120 have a planar interface 130 therebetween. Infrared light signals received through the light ingress openings 182, 184, 186 pass through the optical materials 118, 120 and into the light detectors 128.

The linear optical material 118 has a linear index of refraction, whereas the nonlinear optical material 120 has a nonlinear index of refraction. In particular, the index of refraction of the linear optical material 118 remains constant irrespective of the intensity level of the infrared light passing therethrough. Hence, as the intensity level of the infrared light signals received through the light ingress openings 182, 184, 186 varies, the index of refraction of the linear optical material 118 remains constant. Suitable optical materials for use as the linear optical material 118 of the present invention include glass or quartz.

The index of refraction of the nonlinear optical material 120 varies based on the intensity level of the infrared light passing therethrough. In particular, if the intensity level of the infrared light passing through the nonlinear optical material 120 is below a predetermined intensity threshold value, the index of refraction of the nonlinear optical material 120 remains constant. However, if the intensity level of the infrared light passing through the nonlinear optical material 120 is above the intensity threshold value, the index of refraction of the nonlinear optical material 120 changes. Hence, if the intensity level of the infrared light signals received through the light ingress openings 182, 184, 186 is below the intensity threshold value, the index of refraction of the nonlinear optical material 118 remains constant. However, if the light intensity of the infrared light signals received through the light ingress openings 182, 184, 186 is equal to or above the threshold value, the index of refraction of the nonlinear optical material 118 changes. Suitable optical materials having nonlinear indices or refraction for use as the nonlinear optical material 120 of the present invention are the nonlinear optical materials disclosed in U.S. Pat. No. 5,561,541 entitled "Frustrated Total Internal Reflection Optical Power Limiter" which was issued on Oct. 1, 1996 to Sharp et al, the disclosure of which is hereby incorporated by reference.

The nonlinear optical material 120 preferably has an index of refraction which matches the index of refraction of the linear optical material 118 when the intensity level of the infrared light passing therethrough is below the intensity threshold level. What is meant herein by the terms "match" or "matches" is that the index of refraction of a first material is either equal to, or within a predetermined tolerance range of, the index of refraction a second material. It should be appreciated that if the index of refraction of the linear optical material 118 matches the index of refraction of the nonlinear material 120, infrared light passing therethrough is unattenuated by the optical materials 118, 120. However, if the index of refraction the linear optical material 118 does not match the index of refraction of the nonlinear material 120, infrared light passing therethrough is refracted at the planar interface 130 between the optical materials 118, 120. What is meant herein by the terms "refract", "refracts", "refracted", "refracting", or "refraction" is the bending or redirecting of the infrared light passing through the optical materials 118, 120 such that presence of the infrared light is not detected by the light detectors 128. As shall be discussed below in greater detail, such refraction of the infrared light passing through the optical materials 118, 120 is indicative of the semiconductor wafer 10 having been polished down to the desired level 28.

It should be appreciated that the light source units 162, 164, 166 may be configured to produce infrared light at an intensity level which facilitates endpoint detection of the semiconductor wafer 10 during polishing thereof. In particular, the light source units 162, 164, 166 produce infrared light which passes through the respective radial portions 202, 204, 206 of the semiconductor wafer 10. The intensity level of the infrared light is attenuated or otherwise reduced as the light passes through the semiconductor wafer 10. The degree or magnitude of such attenuation of the intensity level of the infrared light is dependent on the thickness of the semiconductor wafer 10. In particular, as the thickness of the semiconductor wafer 10 decreases due to polishing thereof, the degree of attenuation or reduction of the intensity of the infrared light likewise decreases. Hence, the intensity level of infrared light which has passed through a polished (i.e. thinner) semiconductor wafer 10 is greater relative to the intensity level of infrared light which has passed through an unpolished (i.e. thicker) semiconductor wafer 10.

Prior to being polished to the desired level 28 (see FIG. 1D), the thickness of the semiconductor wafer 10 causes the intensity of the infrared light from the light source units 162, 164, 166 to be attenuated or reduced to an intensity level which is below the intensity threshold level of the nonlinear optical material 120. Hence, prior to being polished to the desired level 28, infrared light passes unattenuated through the optical materials 118, 120 and into the light detectors 128. However, once the semiconductor wafer 10 has been polished to the desired level 28, the intensity level of the infrared light passing therethrough is greater in magnitude than the intensity threshold level of the nonlinear optical material 120 thereby causing the index of refraction of the nonlinear optical material 120 to be changed. Once changed in such a manner, the index of refraction of the nonlinear optical material 120 no longer matches the index of refraction of the linear optical material 118 thereby causing the infrared light passing therethrough to be refracted. Such refraction prevents infrared light from the light source units 162, 164, 166 from being detected by the light detectors 128. As shall be discussed below in more detail, such detection (or lack thereof) may be used to alter operation of the polishing system 30.

The polishing system 30 also includes a controller 82 for controlling the polishing system 30 in order to effectuate the desired polishing results for the semiconductor wafer 10. In particular, the controller 82 is electrically coupled to the displacement mechanism 60 via a signal line 84 to monitor and controllably adjust the polishing path of the semiconductor wafer 10 and the speed at which the semiconductor wafer 10 is moved across the platen assembly 42.

Moreover, the controller 82 is electrically coupled to the platen motor 40 via a signal line 86 in order to monitor the output speed of the platen motor 40 and hence the rotational velocity of the platen assembly 42. The controller 82 adjusts the output speed of the platen motor 40 and hence the rotational velocity of the platen assembly 42 as required by predetermined operating parameters.

The controller 82 is electrically coupled to the slurry flow control mechanism 76 via a signal line 88 in order to monitor the flow rate of the chemical slurry onto the polishing pad 50 of the platen assembly 42. The controller 82 adjusts the flow rate of the chemical slurry onto the polishing pad 50 of the platen assembly 42 as required by predetermined operating parameters.

The controller 82 is electrically coupled to the wafer carrier motor 112 via a signal line 122 in order to monitor the output speed of the wafer carrier motor 112 and hence the rotational velocity of the inner wafer sub-carrier 102. The controller 82 adjusts the output speed of the wafer carrier motor 112 and hence the rotational velocity of the inner wafer sub-carrier 102 as required by predetermined operating parameters. Moreover, as shall be discussed below in more detail, the controller 82 idles or deactuates the wafer carrier motor 112 when the inner radial portion 202 of the semiconductor wafer 10 has been polished to a desired level (i.e. the desired level 28). What is meant herein by the terms "idle", "idles", or "idled" is that power is cutoff to the appropriate wafer carrier motor 112, 114, 116 thereby preventing the wafer carrier motor from driving or otherwise contributing mechanical work to the rotation of the corresponding wafer sub-carrier 102, 104, 106. It should be appreciated that a certain amount of rotational torque from the rotating platen assembly 42 may be transferred to the wafer sub-carrier 102, 104, 106 via the semiconductor wafer 10 thereby causing rotation of the sub-carrier even though the wafer carrier motor 112, 114, 116 corresponding thereto is idled. However, such rotation of the wafer sub-carrier 102, 104, 106 does not increase the downward force on the semiconductor wafer 10 thereby preventing excess material from being removed from the semiconductor wafer 10.

The controller 82 is electrically coupled to the wafer carrier motor 114 via a signal line 124 in order to monitor the output speed of the wafer carrier motor 114 and hence the rotational velocity of the intermediate wafer sub-carrier 104. The controller 82 adjusts the output speed of the wafer carrier motor 114 and hence the rotational velocity of the intermediate wafer sub-carrier 104 as required by predetermined operating parameters. Moreover, as shall be discussed below in more detail, the controller 82 idles or deactuates the wafer carrier motor 114 when the intermediate radial portion 204 of the semiconductor wafer 10 has been polished to a desired level (i.e. the desired level 28).

The controller 82 is electrically coupled to the wafer carrier motor 116 via a signal line 126 in order to monitor the output speed of the wafer carrier motor 116 and hence the rotational velocity of the outer wafer sub-carrier 106. The controller 82 adjusts the output speed of the wafer carrier motor 116 and hence the rotational velocity of the outer wafer sub-carrier 106 as required by predetermined operating parameters. Moreover, as shall be discussed below in more detail, the controller 82 idles or deactuates the wafer carrier motor 116 when the outer radial portion 206 of the semiconductor wafer 10 has been polished to a desired level (i.e. the desired level 28).

Figure 5:
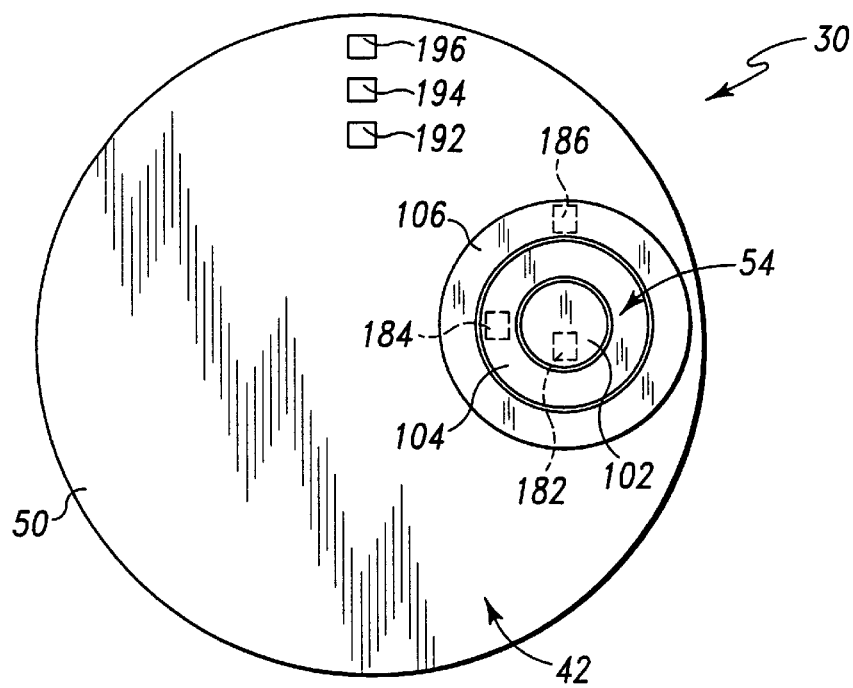
FIG. 5 is a top elevational view of the polishing system of FIG. 2 which shows the relationship between the wafer carrier and the platen assembly.
Figure 6:
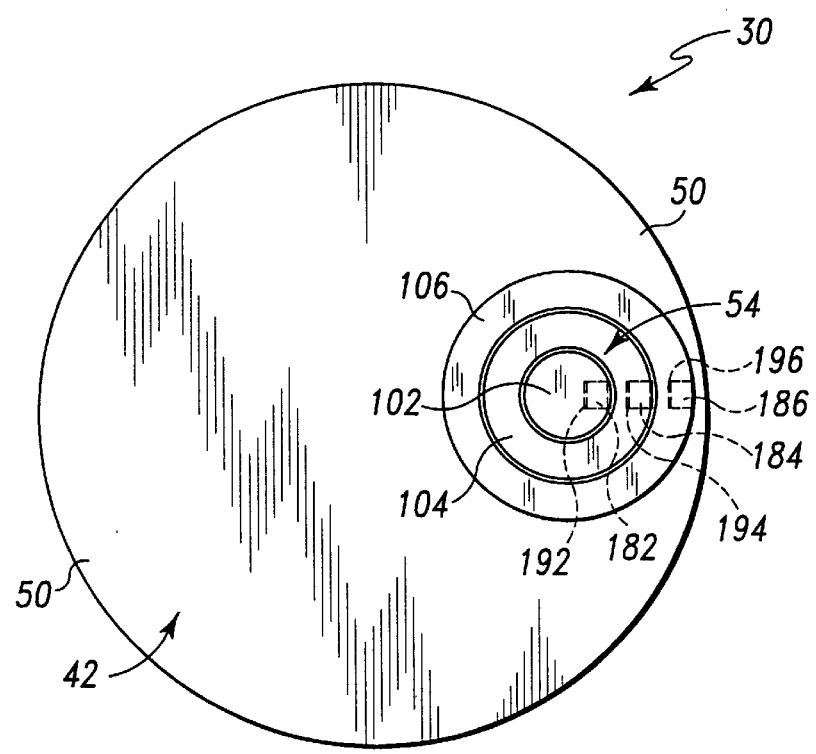
FIG. 6 is a view similar to FIG. 5, but showing the light egress openings of the polishing platen aligned with the light ingress openings of the wafer assembly.

The controller 82 is electrically coupled to the infrared light source units 162, 164, 166 via a number of signal lines 212, 214, 216 in order to selectively actuate the light source units 162, 164, 166. In particular, as shown in FIG. 5, during operation of the polishing system 30, the platen assembly 42 is rotated independently of each of the wafer sub-carriers 102, 104, 106. During such independent rotation, the light egress openings 192, 194, 196 of the platen assembly 42 and hence the light source units 162, 164, 166 may not align with the light ingress openings 182, 184, 186, respectively, of the wafer carrier 54 and hence the light receiving units 172, 174, 176. However, at predetermined points in time, the light egress openings 192, 194, 196 of the platen assembly 42 and hence the light source units 162, 164, 166 align with the light ingress openings 182, 184, 186, respectively, of the wafer carrier 54 and hence the light receiving units 172, 174, 176. At such points in time, the controller 82 generates an output signal on the signal lines 212, 214, 216 which causes the light source units 162, 164, 166, respectively, to generate infrared light signals which are transmitted through the radial portions 202, 204, 206, respectively, of the semiconductor wafer 10 and into the light ingress openings 182, 184, 186, respectively, of the wafer sub-carriers 102, 104, 106, respectively.

The controller 82 is electrically coupled to the light detectors 128 of the light receiving units 172, 174, 176 via a number of signal lines 222, 224, 226, respectively, in order to monitor the output therefrom. In particular, as discussed above, if a particular radial portion 202, 204, 206 of the semiconductor wafer 10 has not been polished down to the desired level 28, the intensity level of the infrared light passing through the semiconductor wafer 10 (i.e. the infrared light signals generated by the light source units 162, 164, 166) after the same has been attenuated by the semiconductor wafer 10 is below the intensity threshold level of the nonlinear optical material 120. In such a case, the infrared light passes unattenuated through the linear optical material 118 and the nonlinear optical material 120 and thereafter posses an intensity level which is above the detection threshold of the light detectors 128 thereby allowing the light detectors 128 to detect presence thereof. Upon detection of infrared light, the light detectors 128 of the light receiving units 172, 174, 176 are operated in a light detected mode of operation in which the light detectors 128 generate a detection control signal which is sent to the controller 82 via the signal lines 222, 224, 226, respectively.

However, if a particular radial portion 202, 204, 206 of the semiconductor wafer 10 has been polished down to the desired level 28, the intensity level of the infrared light passing through the semiconductor wafer 10 (i.e. the infrared light signals generated by the light source units 162, 164, 166) after the same has been attenuated by the semiconductor wafer 10 is above the intensity threshold level of the nonlinear optical material 120. In such a case, the index of refraction of the nonlinear optical material 120 is changed so as not to match the index of refraction of the linear optical material 118. Hence, the infrared light is refracted at the planar interface 130 between the linear optical material 118 and the nonlinear optical material 120. After such refraction, infrared light is not detected by the light detectors 128. Hence, the light detectors 128 of the light receiving units 172, 174, 176 are operated in a no-light mode of operation in which the light detectors do not generate a detection control signal to be sent to the controller 82.

Absence of a detection control signal on any one or more of the signal lines 222, 224, 226 causes the controller 82 to adjust the downward pressure of force being applied to the semiconductor wafer 10 during polishing thereof. In particular, if the controller 82 does not receive a detection control signal on any one or more of the signal lines 222, 224, 226, the controller idles the wafer carrier motor 112, 114, 116 corresponding to the appropriate light receiving unit 172, 174, 176. For example, absence of a detection control signal on the signal line 222 indicates that the inner radial portion 202 of the semiconductor wafer 10 has been polished down to the desired level 28. Hence, the controller 82 communicates with the wafer carrier motor 112 in order to idle the same thereby reducing the downward pressure or force applied to the inner radial portion 202 of the semiconductor wafer 10 by the wafer sub-carrier 102. Similarly, absence of a detection control signal on the signal line 224 indicates that the intermediate radial portion 204 of the semiconductor wafer 10 has been polished down to the desired level 28. Hence, the controller 82 communicates with the wafer carrier motor 114 in order to idle the same thereby reducing the downward pressure or force applied to the intermediate radial portion 204 of the semiconductor wafer 10 by the wafer sub-carrier 104. Moreover, absence of a detection control signal on the signal line 226 indicates that the outer radial portion 206 of the semiconductor wafer 10 has been polished down to the desired level 28. Hence, the controller 82 communicates with the wafer carrier motor 116 in order to idle the same thereby reducing the downward pressure or force applied to the outer radial portion 206 of the semiconductor wafer 10 by the wafer sub-carrier 106.

In operation, the polishing system 30 polishes the semiconductor wafer 10 in order to planarize the front side 38 thereof. In particular, the polishing system 30 removes material from the front side 38 of the semiconductor wafer 10 until the wafer 10 is polished down to the desired level 28. More specifically, the wafer carrier 54 engages the back side 70 of the semiconductor wafer 10 and presses the front side 38 of the semiconductor wafer 10 against the polishing pad 50. The controller 82 then causes the platen motor 40 to rotate the platen assembly 42 and the wafer carrier motors 112, 114, 116 to rotate the wafer sub-carriers 102, 104, 106, respectively. The controller 82 may also begin to control the displacement mechanism 60 so as to move the wafer carrier 54 along a predetermined polishing path. The slurry flow control mechanism 76 is also controlled by the controller 82 in order to apply chemical slurry to the polishing pad 50 at a predetermined flow rate. The resulting complex movement of the wafer carrier 54 relative to the polishing pad 50, the force being applied to the semiconductor wafer 10 in the general direction of arrow 62 of FIG. 2, and the chemical slurry all cooperate to selectively remove material from the front side 38 of the semiconductor wafer 10.

In addition, the controller 82 selectively causes the infrared light source units 162, 164, 166 to generate light signals of infrared light which are transmitted through the radial portions 202, 204, 206, respectively, of the front side 38 of the semiconductor wafer 10. The controller 82 also monitors the output from the light detectors 128 associated with each of the light receiving units 172, 174, 176 which correspond to the changing thickness of the semiconductor wafer 10. From such monitoring of the light detectors 128, the controller 82 determines if any of the radial portions 202, 204, 206 have been polished to the desired level 28 and thereafter idles a corresponding wafer carrier motor 112, 114, 116 if the corresponding radial portion 202, 204, 206 has reached the desired level 28.

Figure 9:
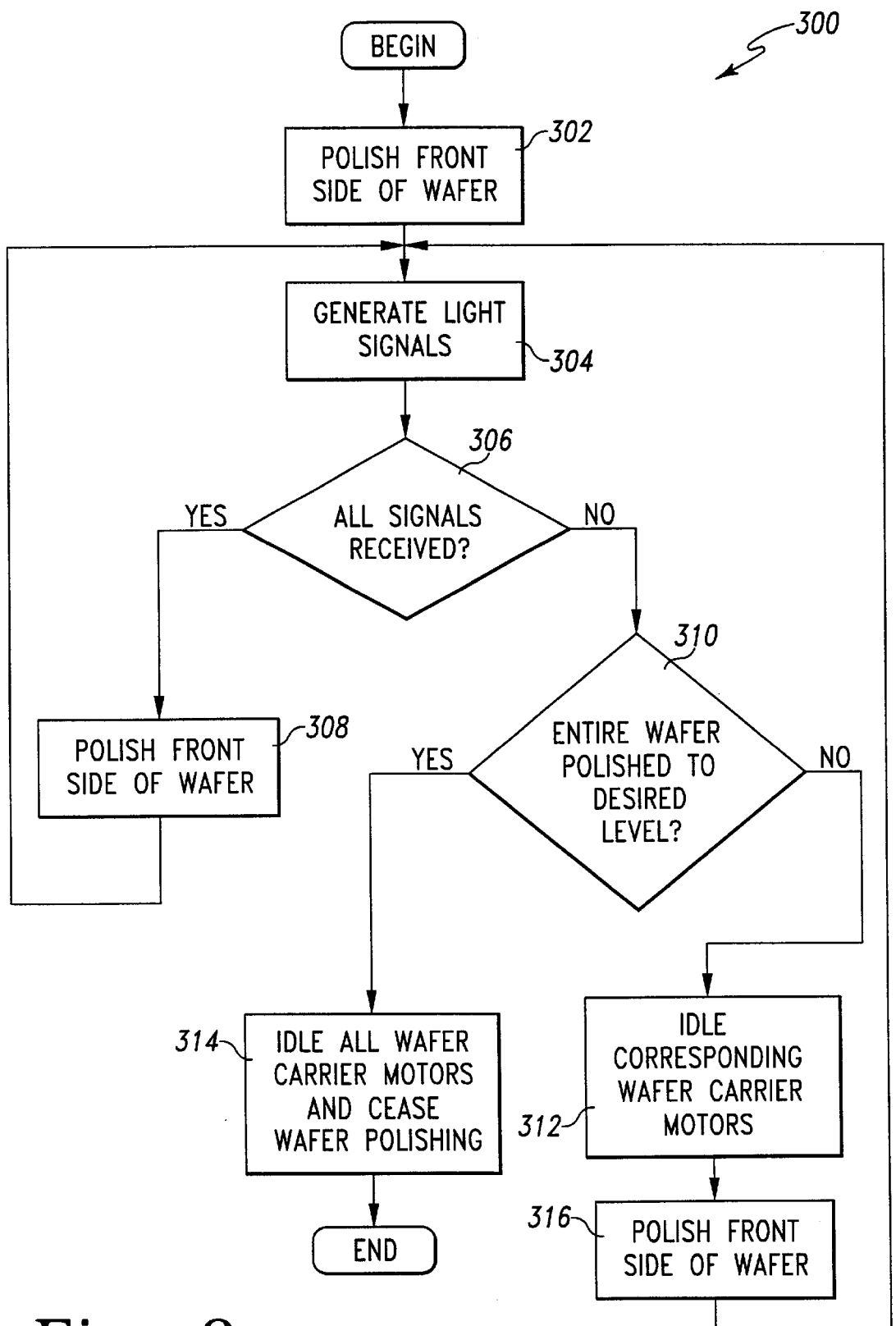
FIG. 9 shows a flowchart of a polishing procedure used by the polishing system of FIG. 2.

A polishing procedure 300 utilized by the polishing system 30 to polish the semiconductor wafer 10 according to the present invention is shown in FIG. 9. The polishing procedure 300 begins with step 302 in which the controller 82 causes the polishing system 30 to begin polishing the front side 38 of the semiconductor wafer 10 in order to remove material therefrom. In particular, the controller 82 actuates the platen motor 40 in order to cause the platen assembly 42 to be rotated. Thereafter, the controller 82 actuates the wafer carrier motors 112, 114, 116 thereby causing the wafer sub-carriers 102, 104, 106, respectively, and hence the semiconductor wafer 10 to be rotated so as to rub the front side 38 of the semiconductor wafer 10 against the rotating platen assembly 42. The controller 82 also actuates the displacement mechanism 60 in order to cause the displacement mechanism 60 to selectively move the wafer carrier 54 and hence the wafer 10 along a predetermined polishing path. Moreover, the controller 82 causes the chemical slurry supply system 72 to apply chemical slurry to the polishing pad 50 of the platen assembly 42 in order to facilitate the removal of material from the front side 38 of the semiconductor wafer 10. The procedure 300 then advances to step 304.

In step 304, the controller 82 causes the light source units 162, 164, 166 to generate infrared light signals. In particular, at the point in time in which the light egress openings 192, 194, 196 of the platen assembly 42 and hence the light source units 162, 164, 166 align with the light ingress openings 192, 194, 196, respectively, of the wafer carrier 54 and hence the light receiving units 172, 174, 176, the controller 82 generates an output signal on the signal lines 212, 214, 216 which causes the light source units 162, 164, 166, respectively, to generate infrared light signals. Such infrared light signals are transmitted through the radial portions 202, 204, 206, of the semiconductor wafer 10 and into the light ingress openings 192, 194, 196, respectively, of the wafer sub-carriers 102, 104, 106, respectively. The procedure 300 then advances to step 306.

In step 306, the controller 82 determines if the infrared light signals generated by the light source units 162, 164, 166 are detected by the light receiving units 172, 174, 176, respectively. In particular, as discussed above, if the semiconductor wafer 10 has not been polished to the desired level 28, infrared light corresponding to the light signals generated by the light source units 162, 164, 166 is detected by the light detectors 128 of each of the light receiving units 172, 174, 176, respectively. Hence, in step 306, if infrared light is detected by light detectors 128 associated with each of the light receiving units 172, 174, 176, the procedure 300 advances to step 308. If infrared light is not detected by one or more of the light detectors 128 associated with the light receiving units 172, 174, 176, the procedure 300 advances to step 310.

In step 308, the controller 82 concludes that none of the radial portions 202, 204, 206 of the semiconductor wafer 10 have been polished to the desired level 28. This is true since each of the light detectors 128 of the light receiving units 172, 174, 176 detected infrared light associated with the light signals generated by the light source units 162, 164, 166. Hence, in step 308, the controller 82 communicates with the platen motor 40, the wafer carrier motors 112, 114, 116, the displacement mechanism 60, and the slurry flow control 76 in order to continue polishing of the semiconductor wafer 10 in the manner previously discussed. The procedure 300 then loops back to step 304 in order to generate subsequent infrared light signals to monitor the decreasing thickness of the semiconductor wafer 10 during polishing thereof.

Returning now to step 306, if infrared light is not detected by one or more of the light detectors 128 associated with the light receiving units 172, 174, 176, the procedure 300 advances to step 310. In step 310, the controller 82 determines if the entire semiconductor wafer 10 has been polished to the desired level 28. In particular, the controller 82 determines which of the light receiving units 172, 174, 176 detected infrared light associated with the light signals generated by light source units 162, 164, 166, respectively. It should be appreciated that if none of light receiving units 172, 174, 176 detected infrared light associated with the light signals generated by light source units 162, 164, 166, respectively, each of the radial portions 202, 204, 206 of the semiconductor wafer 10 has been polished to the desired level 28. However, if one or more of the light receiving units 172, 174, 176 detected infrared light associated with the light signals generated by the light source units 162, 164, 166, respectively, the radial portion 202, 204, 206 corresponding thereto has not been polished down to the desired level 28. For example, if the light detector 128 associated with each of the light receiving units 172 and 174 detects infrared light, whereas the light detector 128 associated with the light receiving unit 176 does not detect infrared light, the entire semiconductor wafer 10 has not been polished to the desired level 28. In particular, since the light receiving units 172 and 174 detected infrared light, the inner radial portion 202 and the intermediate portion 204 of the semiconductor wafer 10 have not been polished down to the desired level 28. However, since the light receiving unit 176 did not detect infrared light, the outer radial portion 206 of the semiconductor wafer 10 has been polished to the desired level 28. Hence, in step 310, if the entire semiconductor wafer 10 has not been polished to the desired level 28, the procedure 300 advances to step 312. If the entire semiconductor wafer 10 has been polished to the desired level, the procedure 300 advances to step 314.

In step 312, the controller 82 idles the wafer carrier motors 112, 114, 116 corresponding to the radial portions 202, 204, 206 of the semiconductor wafer 10 which have been polished to the desired level 28. For example, if the controller 82 determined in step 310 that the inner radial portion 202 and the intermediate radial portion 204 of the semiconductor 10 have not been polished down the desired level 28, but the outer radial portion 206 of the semiconductor wafer 10 has been polished down to the desired level 28, the controller 82 continues operation of the wafer carrier motors 172 and 174, but idles the wafer carrier motor 176. Once the appropriate wafer carrier motors 172, 174, 176 have been idled, the procedure 300 advances to step 316.

In step 316, the controller 82 communicates with the platen motor 40, the remaining wafer carrier motors (i.e. the wafer carrier motors 112, 114, 116 which were not idled in step 312), the displacement mechanism 60, and the slurry flow control 76 in order to continue polishing of the semiconductor wafer 10 in the manner previously discussed. The procedure 300 then loops back to step 304 in order to generate subsequent infrared light signals to monitor the decreasing thickness of the semiconductor wafer 10 during polishing thereof.

Returning now to step 310, if the entire semiconductor wafer 10 has been polished to the desired level, the procedure 300 advances to step 314. In step 314, the controller 82 ceases polishing of the semiconductor wafer 10. In particular, the controller 82 communicates with the platen motor 40, the wafer carrier motors 112, 114, 116, the displacement mechanism 60, and the slurry flow control 76 in order to cease polishing of the semiconductor wafer 10. However, it should be appreciated that the controller 82 may allow the polishing system 30 to continue polishing the semiconductor wafer 10 for a short, predetermined amount of time in order to further remove material from the semiconductor wafer 10. This further removal of material or overpolishing may be desirable after certain steps of a fabrication process. The procedure 300 then ends thereby placing the polishing system 30 in an idle state until actuated to polish a subsequent semiconductor wafer.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

What is claimed is:

1. An apparatus for polishing a first side of a semiconductor wafer down to a desired level, comprising:
   a polishing platen having a polishing surface;
   a wafer carrier having a first sub-carrier and a second sub-carrier which is concentric to said first sub-carrier, wherein (i) said first sub-carrier is configured to (a) engage a first radial portion of said wafer by a second side of said wafer, and (b) apply first pressure to said first radial portion in order to press said first radial portion against said polishing surface of said polishing platen, and (ii) said second sub-carrier is configured to (a) engage a second radial portion of said wafer by said second side of said wafer, and (b) apply second pressure to said second radial portion in order to press said second radial portion against said polishing surface of said polishing platen;
   a first endpoint detector operable to (i) determine when said first radial portion of said wafer has reached said desired level, and (ii) cause said first sub-carrier to adjust said first pressure applied to said first radial portion of said wafer in response to determining that said first radial portion has reach said desired level; and
   a second endpoint detector operable to (i) determine when said second radial portion of said wafer has reached said desired level, and (ii) cause said second sub-carrier to adjust said second pressure applied to said second radial portion of said wafer in response to determining that said second radial portion has reach said desired level.

2. The apparatus of claim 1, wherein:
   said first endpoint detector includes a first light source unit and a first light receiving unit,
   said first light source unit is positioned such that a first light signal generated by said first light source unit is propagated through said first radial portion of said wafer to said first light receiving unit,
   said second endpoint detector includes a second light source unit and a second light receiving unit, and
   said second light source unit is positioned such that a second light signal generated by said second light source unit is propagated through said second radial portion of said wafer to said second light receiving unit.

3. The apparatus of claim 2, wherein:
   said first light source unit secured to said polishing platen,
   said first light receiving unit secured to said first sub-carrier such that said first light signal generated by said first light source unit is propagated through said first radial portion of said wafer to said first light receiving unit,
   said second light source unit secured to said polishing platen, and
   said second light receiving unit secured to said second sub-carrier such that said second light signal generated by said second light source unit is propagated through said second radial portion of said wafer to said second light receiving unit.

4. The apparatus of claim 2, wherein:
   both said first light source unit and said second light source unit include an infrared light source unit,
   said first light source unit transmits a first infrared light signal through said first radial portion of said wafer, and
   said second light source unit transmits a second infrared light signal through said second radial portion of said wafer.

5. The apparatus of claim 2, wherein:
   said first light receiving unit includes a first optical material and a second optical material having a first interface therebetween,
   said first optical material has a first linear index of refraction,
   said second optical material has a first nonlinear index of refraction which is dependent on a first intensity level of said first light signal received with said first light receiving unit,
   said first light signal is refracted at said first interface if said first linear index of refraction of said first optical material does not match said first nonlinear index of refraction of said second optical material, and
   said first linear index of refraction of said first optical material does not match said first nonlinear index of refraction of said second optical material when said first radial portion of said wafer has been polished down to said desired level.

6. The apparatus of claim 5, wherein:
   said first light receiving unit further includes a first light detector,
   said first light detector is positioned such that said first light signal is directed onto said first light detector after said first light signal propagates through said first optical material and said second optical material,
   said first light detector has a first light detected mode of operation and a first no-light detected mode of operation,
   said first light detector operates in said first light detected mode of operation when said first light signal is unattenuated by said first interface between said first optical material and said second optical material, and
   said first light detector operates in said first no-light detected mode of operation when said first light signal is refracted by said first interface between said first optical material and said second optical material.

7. The apparatus of claim 6, wherein:
   said second light receiving unit includes a third optical material and a fourth optical material having a second interface therebetween,
   said third optical material has a second linear index of refraction,
   said fourth optical material has a second nonlinear index of refraction which is dependent on a second intensity level of said second light signal received with said second light receiving unit,
   said second light signal is refracted at said second interface if said second linear index of refraction of said third optical material does not match said second nonlinear index of refraction of said fourth optical material, and
   said second linear index of refraction of said third optical material does not match said second nonlinear index of refraction of said fourth optical material when said second radial portion of said wafer has been polished down to said desired level.

8. The apparatus of claim 7, wherein:
   said second light receiving unit further includes a second light detector,
   said second light detector is positioned such that said second light signal is directed onto said second light detector after said second light signal propagates through said third optical material and said fourth optical material, said second light detector has a second light detected mode of operation and a second no-light detected mode of operation, said second light detector operates in said second light detected mode of operation when said second light signal is unattenuated by said second interface between said third optical material and said fourth material, and said second light detector operates in said second no-light detected mode of operation when said second light signal is refracted by said second interface between said third optical material and said fourth optical material.

9. The apparatus of claim 1, further comprising a first wafer motor and a second wafer motor, wherein:

said first wafer motor is coupled to said first sub-carrier such that operation of said first wafer motor causes said first sub-carrier to adjust said first pressure applied to said first radial portion of said wafer, said second wafer motor is coupled to said second sub-carrier such that operation of said second wafer motor causes said second sub-carrier to adjust said second pressure applied to said second radial portion of said wafer, said first endpoint detector causes said first wafer motor to adjust said first pressure applied to said first radial portion of said wafer when said first endpoint detector determines that said first radial portion of said wafer has reached said desired level, and said second endpoint detector causes said second wafer motor to adjust said second pressure applied to said second radial portion of said wafer when said second endpoint detector determines that said second radial portion of said wafer has reached said desired level.

10. The apparatus of claim 9, wherein:

said first endpoint detector idles said first wafer motor when said first endpoint detector determines that said first radial portion of said wafer has reached said desired level, and said second endpoint detector idles said second wafer motor when said second endpoint detector determines that said second radial portion of said wafer has reached said desired level.

11. The apparatus of claim 1, wherein said second sub-carrier is configured to rotate independently of said first sub-carrier.

12. The apparatus of claim 1, wherein:

said second sub-carrier includes a substantially annular-shaped member which defines an inner void, and said first sub-carrier is positioned within said inner void.

13. The apparatus of claim 12, wherein:

an outer periphery of said inner void has a substantially circular shape, and said first sub-carrier includes a substantially circular-shaped member which is positioned within said substantially circular inner void.

14. A method of operating a polishing system to polish a first side of a semiconductor wafer down to a desired level, said polishing system having a wafer carrier which includes a first sub-carrier and a second sub-carrier which is concentric to said first sub-carrier, comprising the steps of:

rotating said wafer while said first side of said wafer contacts a polishing surface of a polishing platen in order to remove material from said first side of said wafer;

applying first pressure to a first radial portion of said wafer with said first sub-carrier in order to press said first radial portion against said polishing surface of said polishing platen;

applying second pressure to a second radial portion of said wafer with said second sub-carrier in order to press said second radial portion against said polishing surface of said polishing platen;

determining when said first radial portion of said wafer has been polished down to said desired level and adjusting said first pressure applied to said first radial portion by said first sub-carrier in response thereto; and determining when said second radial portion of said wafer has been polished down to said desired level and adjusting said second pressure applied to said second radial portion by said second sub-carrier in response thereto.

15. The method of claim 11, wherein:

said first radial portion determining step includes the steps of (i) transmitting a first light signal through said first radial portion of said wafer such that said first light signal propagates through said first radial portion of said wafer and causes a first attenuated signal to be emanated out of a second side of said wafer, and (ii) adjusting said first pressure applied to said first radial portion by said first sub-carrier based on a first intensity level of said first attenuated signal, and said second radial portion determining step includes the steps of (i) transmitting a second light signal through said second radial portion of said wafer such that said second light signal propagates through said second radial portion of said wafer and causes a second attenuated signal to be emanated out of said second side of said wafer, and (ii) adjusting said second pressure applied to said second radial portion by said second sub-carrier based on a second intensity level of said second attenuated signal.

16. The method of claim 14, wherein:

said first pressure applying step includes the step of operating a first wafer motor so as to rotate said first sub-carrier, said second pressure applying step includes the step of operating a second wafer motor so as to rotate said second sub-carrier, said first radial portion determining step includes the step of determining when said first radial portion of said wafer has been polished down to said desired level and adjusting mechanical output of said first wafer motor in response thereto, and said second radial portion determining step includes the step of determining when said second radial portion of said wafer has been polished down to said desired level and adjusting mechanical output of said second wafer motor in response thereto.

17. The method of claim 16, wherein:

said first radial portion determining step further includes the step of determining when said first radial portion of said wafer has been polished down to said desired level and idling said first wafer motor in response thereto, and said second radial portion determining step includes the step of determining when said second radial portion of said wafer has been polished down to said desired level and idling said second wafer motor in response thereto.

18. The method of claim 14, wherein said second sub-carrier rotates independently of said first sub-carrier during said wafer rotating step.

19. The method of claim 14, wherein:

said second sub-carrier includes a substantially annular-shaped member which defines an inner void, and said first sub-carrier is positioned within said inner void.

20. The method of claim 19, wherein:

an outer periphery of said inner void has a substantially circular shape, and said first sub-carrier includes a substantially circular-shaped member which is positioned within said substantially circular inner void.

21. An apparatus for polishing a first side of a semiconductor wafer down a desired level, comprising:

a polishing platen having a polishing surface;

a wafer carrier having a first sub-carrier and a second sub-carrier which is concentric to said first sub-carrier, wherein (i) said first sub-carrier is configured to (a) engage a first radial portion of said wafer by a second side of said wafer, and (b) apply first pressure to said first radial portion in order to press said first radial portion against said polishing surface of said polishing platen, and (ii) said second sub-carrier is configured to (a) engage a second radial portion of said wafer by said second side of said wafer, and (b) apply second pressure to said second radial portion in order to press said second radial portion against said polishing surface of said polishing platen;

a first endpoint detector operable to (i) transmit a first light signal which propagates through said first radial portion of said wafer such that a first attenuated signal is emanated out of a second side of said wafer, and (ii) cause said first sub-carrier to adjust said first pressure applied to said first radial portion of said wafer based on a first intensity level of said first attenuated signal; and a second endpoint detector operable to (i) transmit a second light signal which propagates through said first radial portion of said wafer such that a second attenuated signal is emanated out of said second side of said wafer, and (ii) cause said second sub-carrier to adjust said second pressure applied to said second radial portion of said wafer based on a second intensity level of said second attenuated signal.

22. The apparatus of claim 21, wherein said second sub-carrier is configured to rotate independently of said first sub-carrier.

23. The apparatus of claim 21, wherein:

said first endpoint detector includes a first light source unit secured to said polishing platen and a first light receiving unit secured to said first sub-carrier, said first light source unit transmits said first light signal through said first radial portion of said wafer to said first light receiving unit, said second endpoint detector includes a second light source unit secured to said polishing platen and a second light receiving unit secured to said second sub-carrier, and said second light source unit transmits said second light signal through said second radial portion of said wafer to said second light receiving unit.

24. The apparatus of claim 23, wherein:

both said first light source unit and said second light source unit include an infrared light source unit, said first light source unit transmits a first infrared light signal through said first radial portion of said wafer, and said second light source unit transmits a second infrared light signal through said second radial portion of said wafer.

25. The apparatus of claim 21, further comprising a first wafer motor and second wafer motor, wherein:

said first wafer motor is coupled to said first sub-carrier such that operation of said first wafer motor causes said first sub-carrier to adjust said first pressure applied to said first radial portion of said wafer, said second wafer motor is coupled to said second sub-carrier such that operation of said second wafer motor causes said second sub-carrier to adjust said second pressure applied to said second radial portion of said wafer, said first endpoint detector causes said first wafer motor to adjust said first pressure applied to said first radial portion of said wafer based on said first intensity level of said first attenuated signal, and said second endpoint detector causes said second wafer motor to adjust said second pressure applied to said second radial portion of said wafer based on said second intensity level of said second attenuated signal.

26. The apparatus of claim 25, wherein:

said first endpoint detector idles said first wafer motor based on said first intensity level of said first attenuated signal, and said second endpoint detector idles said second wafer motor based on said second intensity level of said second attenuated signal.

27. The apparatus of claim 21, wherein:

said second sub-carrier includes a substantially annular-shaped member which defines an inner void, and said first sub-carrier is positioned within said inner void.

28. The apparatus of claim 27, wherein:

an outer periphery of said inner void has a substantially circular shape, and said first sub-carrier includes a substantially circular-shaped member which is positioned within said substantially circular inner void.

* * * * *